ent Number: 4,510,230
United States Patent [19]
Coveleskie et al.

[11] Patent Number: 4,510,230
[45] Date of Patent: Apr. 9, 1985

[54] PHOTOPOLYMERIZABLE COMPOSITIONS AND ELEMENTS CONTAINING ACID TO REDUCE SCUM AND STAIN FORMATION

[75] Inventors: Richard A. Coveleskie, Sayre, Pa.; Shung-Yan L. Lee, Wilmington, Del.

[73] Assignee: E. I. Du Pont de Nemours and Company, Wilmington, Del.

[21] Appl. No.: 523,323

[22] Filed: Aug. 15, 1983

Related U.S. Application Data

[63] Continuation-in-part of Ser. No. 367,763, Apr. 12, 1982, abandoned.

[51] Int. Cl.$^3$ .......................... G03C 1/94; G03C 1/68
[52] U.S. Cl. .................................... 430/273; 430/281; 430/275; 430/277; 204/159.15
[58] Field of Search .............. 430/273, 281, 277, 275, 430/318; 204/159.16, 159.11, 159.15, 159.19, 159.22

[56] References Cited

U.S. PATENT DOCUMENTS 3,859,099  1/1975  Petropoulos et al. ...... 204/159.11 X
4,347,303  8/1982  Asano et al. .................... 430/281 X

OTHER PUBLICATIONS

Laurence Urdang and Stuart B. Flexner (eds), "directly", *The Random House College Dictionary*, (Random House, Inc., New York, New York), 1973, p. 376.

*Primary Examiner*—John E. Kittle
*Assistant Examiner*—Cynthia Hamilton

[57] ABSTRACT

Aqueous processable photopolymerizable compositions comprising a polymerizable ethylenically unsaturated monomer, a photoinitiator or photoinitiator system, and acid binder are described which give increased resistance to stain or scum formation on copper surfaces upon incorporation of an acid having a molecular weight not greater than 300 with a solubility of at least 0.01 grams in 100 grams water at 20° C. and a dissociation constant in a range from $1 \times 10^{-5}$ to $5 \times 10^{-2}$. Water soluble acids which readily give up protons such as citric, malonic, malic, and maleic and are suitable.

10 Claims, No Drawings

PHOTOPOLYMERIZABLE COMPOSITIONS AND ELEMENTS CONTAINING ACID TO REDUCE SCUM AND STAIN FORMATION

RELATED APPLICATION

This is a continuation-in-part of Ser. No. 367,763, filed Apr. 12, 1982 and now abandoned.

BACKGROUND OF THE INVENTION

This invention relates to a photopolymerizable resist material. More particularly, it relates to aqueous processable resist compositions which can be laminated to copper surfaces.

Photopolymerizable resist materials are known from U.S. Pat. No. 3,469,982 which describes preparing a film resist in the form of a photopolymerizable layer sandwiched between a cover sheet and a temporary support. This film resist may then be laminated to copper or copper-laminated board and exposed and processed to provide a photopolymerized layer which acts as a resist for subsequent etching.

Aqueous processable photopolymerizable resists offer significant advantages to the printed circuit industry in terms of lower costs and environmental safeguards. Acid binders have played an important role in the production of such resists. Acid binders are described in German Pat. No. 2,123,702; U.S. Pat. No. 4,273,857; U.S. Pat. No. 3,458,311; and U.K. Pat. No. 1,507,704.

In the manufacture of printed circuit boards from photoresist element, it is necessary to laminate the photosensitive layer of the element to the substrate board. U.S. Pat. No. 3,547,730 discloses the lamination process whereby the layer achieves sufficient adhesion to the substrate to withstand subsequent photoresist processing steps of development, etching and plating.

One of the problems with the use of resists has been adhesion properties. U.S. Pat. No. 3,622,334 described adding hetercyclic nitrogen-containing compounds such as benzimidazole to the photopolymerizable composition to improve the adhesion of photopolymer resist films used in aqueous plating solutions. While this technique is beneficial for a resist which is removed by an organic solvent, it led to stain and scumming on a copper surface to which an aqueous processable, acid binder resist formulation has been laminated, particularly when several days elapsed between lamination and development.

SUMMARY OF THE INVENTION

In accordance with this invention, an improved element is provided of a copper substrate with processable photopolymerizable resist composition substrate comprising a photopolymerizable ethylenically unsaturated monomer, a photoinitiator or photoinitiator system and a binder having an acid number greater than 100 whereby the improvement comprises incorporation into the composition of an acid having a molecular weight not greater than 300 with a solubility of at least 0.01 grams acid in 100 grams of water at 20° C. and a dissociation constant in the range from $1 \times 10^{-5}$ to $5 \times 10^{-2}$. The acid is present in an amount sufficient to inhibit scum or stain formation on a copper surface.

DETAILED DESCRIPTION OF THE INVENTION

With conventional aqueous processable photopolymerizable resist compositions which contain a polymerizable ethylenically unsaturated monomer, a photoinitiator or photoinitiation system and a binder with an acid number greater than 100, an undesirable result which is present due primarily to the binder is the formation of undesirable scum or stain on a copper surface to which the composition is laminated. Acceptable results are not obtained if the resist remains in contact with the copper for a period of more than a few hours. While it is possible to minimize the problem by promptly processing the laminated resist, this is not a practical solution when many laminated boards must go through a single processing machine. In some cases development must be delayed when more than one fabrication step is required for the laminated resist.

A light tan stain was observed on copper surfaces used in tests of lamination and removal of resists with various binder ingredients. The most noticable staining occurred with low molecular weight (about 6,000) binders having high acid numbers, e.g., an acid number of at least 100 and more conventionally an acid number of at least 200. Then as further testing was conducted on samples which had resist formulations laminated to a copper surface for a week or more, the copper surface retained an irregular residual coating after the resist was dissolved off with an alkaline solution.

In accordance with the present invention, the addition of an acid having a molecular weight not greater than 300 with a solubility of at lest 0.01 grams acid in 100 grams of water at 20° C. and a dissociation constant in a range from $1 \times 10^{-5}$ to $5 \times 10^{-2}$ reduces or minimizes the scum or stain formation. Generally the acid will have a molecular weight not greater than 250. The acid is introduced into the photopolymerizable resist composition (conventionally present as a film) in an amount sufficient to improve scum or stain resistance. The addition of 0.01 to 1.0% by weight of acid is satisfactory (based on the weight of the other components of the photopolymerizable composition), i.e., the weight of the photopolymerizable manner, the photoinitiator or photoinitiator system and binder). A preferred range is 0.1 to 0.5% to obtain significant scum or stain resistance. Higher acid concentrations can be used. The upper limit of acid is not critical except the acid should not significantly interfere with the adhesion of the photopolymerizable composition. Preferably the acid is a carboxylic acid.

The desirable properties exhibited by the acids of the present invention are water solubility and ready release of protons. Excluded are weak organic acids with a dissociation constant below $1 \times 10^{-5}$. The stain and scum protection afforded by the present invention is believed to be due to the ability of these acids to diffuse to the copper surface and provide a protective coating before the acid groups on the binder can become attached to the copper surface. The attachment must not be too strong or acid will not be removed by the aqueous processing of the resist. This undesirable effect occurs with oxalic acid (dissociation constant $5.4 \times 10^{-2}$) which forms a strong bond with the copper surface.

Acids found to be particularly useful for the practice of the present invention are citric, malonic, malic, and maleic acid. Also found to be useful were sebacic, benzoic, chlorosuccinic, pimelic, azelaic, adipic, glutaric, phthalic, and succinic acids.

It is required that the aqueous processible resist composition is applied directly to a copper substrate. In the present context "directly" means that there is no intervening layer of a type which could prevent a comparable resist composition, i.e. the composition without the presence of the acid, from staining a copper substrate. For example, a small amount of an adhering agent between the copper and the resist composition could be tolerated. Generally no intervening material would be present and the resist composition contacts the copper substrate.

Without being bound to any theory, it is considered that the addition of the acid of the present invention into the aqueous photopolymerizable composition functions differently from an effect of increasing coating adhesion to the copper substrate. U.S. Pat. No. 3,622,334 discloses compounds such as benzotriazole and 5-chlorobenzotriazole to increase adhesion to a substrate of a photopolymerizable resist.

A chelator such as benzotriazole can be strongly bonded to the copper surface. X-ray diffraction and electromechanical studies reported by G. W. Poling in Corros. Sci. 10 (5) 359 (1970) indicate that benzotriazole functions by forming a chemical complex with copper ions on the surface to produce a highly-impermeable physical barrier layer. It was initially believed that incorporation of benzotriazole in a resist formulation containing high acid number binder would be a way of inhibiting the stain and scum formation on copper. Results revealed that benzotriazole and 5-chlorobenzotriazole can give some improvement; but fully satisfactory results were not obtained on samples aged for two weeks using a binder with an acid number of 200. A sample resist of this same formulation held for four weeks laminated to a copper circuit board gave even heavier deposits on the copper than previously observed, indicating that the surface interaction is a slow but continuous process. While excellent results could be obtained using benzotriazole and 5-chlorobenzotriazole with binders of acid numbers below 100, this technique was failing in tests with much more acid binders.

The stain and scum represent surface residues which can interfere with etching if they cannot be removed or are not subject to attack by the etchant. While a soaking and/or cleaning step could be used to eliminate the stain or scum prior to etching, this would negate the advantage of faster or lower temperature processing related to the use of high acid binders.

It is possible to get a rough idea of the effect of the surface stain or scum residues on etching by comparing etching times of test formulations with the time required to etch a freshly-scrubbed control under the same conditions. However, this was not a sensitive test for these residues and a more sensitive test was developed.

A contact angle test determines the amount of residue. It involves measuring how the equilibrium contact angle for water or a water solution on a copper panel changes with etchant dip time. The contact angle is a sensitive measure of how clear a copper panel is in relation to a freshly-scrubbed and etched panel which consistently gives a contact angle of less than 10°. By comparison, on laminated and developed panels, the contact angle is about 60° to 70° which shows the presence of a residue. The length of dip time in an etchant to obtain an angle below 10° then represents a quantitative measure of the extent of residues. For consistent results, there must be careful control over etchant temperature, agitation, and time between removal from etchant and water rinse, and measurement. Because of the effect of air oxidation on the copper surface, the measurement should be done within five minutes of etching and rinsing. While water is the most convenient wetting agent to use, the test sensitivity can be increased by using a 2% ethyl cellosolve water solution.

The photopolymer resist composition is prepared from polymeric components (binders), monomeric components, initiators and optionally inhibitors.

Suitable binders which can be used as the sole binder or in combination with others include the following: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having average molecular weights from about 4,000 to 1,000,000; epoxides, e.g., epoxides containing acrylate or methacrylate groups; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose esters, e.g., methyl cellulose, ethyl cellulose and benzyl cellulose; polycarbonates; polyvinyl acetal, e.g., polyvinyl butyral, polyvinyl formal; polyformaldehydes.

Preferably, the binder should contain sufficient acidic or other groups to render the composition processible in aqueous developer. Useful aqueous-processible binders include those disclosed in U.S. Pat. No. 1,507,704. Useful amphoteric polymers include interpolymers derived from N-alkylacrylamides or methacrylamides, acidic film-forming comonomer and an alkyl or hydroxyalkyl acrylate such as those disclosed in U.S. Pat. No. 3,927,199.

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl)ether of bisphenol-A, di-(2-methacryloxyethyl)ether of bisphenol-A, di-(3-acryloxy-2-hydroxypropyl)ether of bisphenol-A, di-(2-acryloxyethyl)ether of bisphenol-A, di-(3-methacryloxy-2-hydroxypropyl)ether of tetrachloro-bisphenol-A, di-(2-methacryloxyethyl)ether of tetrachloro-bisphenol-A, di-(3-methacryloxy-2-hydroxypropyl)ether of tetrabromo-bisphenol-A, di-(2-methacryloxyethyl)ether of tetrabromo-bisphenol-A, di-(3-methacryloxy-2-hydroxypropyl)ether of 1,4-butanediol, di(3-methacryloxy-2-hydroxypropyl)ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

In addition to the ethylenically unsaturated monomers mentioned above, the layer can also contain at least one of the following free radical-initiated, chain-propagating, addition-polymerizable, ethylenically unsaturated compounds having a molecular weight of at least 300. Preferred monomers of this type are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Especially preferred are those wherein at least one and preferably most of such linkages are conjugated with a double bonded carbon, including carbon double bonded to carbon and to such heteroatoms as nitrogen, oxygen and sulfur. Outstanding are such materials wherein the ethylenically unsaturated groups, especially the vinylidene groups, are conjugated with ester or amide structures.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; alpha-hydrocarbon-substituted aromatic acyloins, including alpha-methylbenzoin, alpha-allylbenzoin and alpha-phenylbenzoin. Photoreducible dyes and reducing agents disclosed in U.S. Pat. Nos.: 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenylimidazolyl dimers with hydrogen donors, and mixtures thereof as described in U.S. Pat. Nos.: 3,427,161; 3,479,185; and 3,549,367 can be used as initiators. Also useful with photoinitiators and photoinhibitors are sensitizers disclosed in U.S. Pat. No. 4,162,162.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibition are the nitroso compositions disclosed in U.S. Pat. No. 4,168,982.

Various dyes and pigments may be added to increase the visibility of the resist image. Any colorant used, however, should preferably be transparent to the actinic radiation used.

Generally, suitable substrates for the process of the invention involving printed circuit formation are those which have mechanical strength, chemical resistance and good dielectric properties. Thus, most board materials for printed circuits are thermosetting or thermoplastic resins usually combined with a reinforcing filler. Thermosetting resins with reinforcing fillers are ordinarily used for rigid boards, whereas thermoplastic resin without reinforcements are usually used for flexible circuit boards.

Typical board construction involves combinations such as phenolic or epoxy resins on paper or a paper-glass composite, as well as polyester, epoxy, polyimide, polytetrafluoroethylene, or polystyrene as glass. In most instances, the board is clad with a thin layer of electroconductive metal of which copper is by far the most common.

It will be recognized by those skilled in the art that it will be preferable for the printed circuit substrate surface which is to be laminated to be clean and free of any extraneous material which might render any significant amount of the surface nonwettable. For this reason, it will frequently be desired to clean printed circuit substrates prior to lamination by one or more of the several cleaning processes which are well-known in the field of printed circuit board manufacture. The particular type of cleaning depends upon the type of contamination—organic, particulate or metallic. Such methods include degreasing with solvents and solvent emulsions, mechanical scrubbing, alkaline soaks, acidification and the like, followed by rinsing and drying.

In the practice of the present invention, a variety of supports may be used for the resist element. A suitable support having a high degree of dimensional stability to temperature changes may be chosen from a wide variety of films composed of high polymers, e.g., polyamides, polyolefins, polyesters, vinyl polymers, and cellulose esters. A preferred support for the present invention is polyethylene terephthalate.

Suitable protective cover sheets may be chosen from the same group of polymer films listed as supports. Polyethylene and polyethylene terephthalate are particularly useful as cover sheets for resist elements of the present invention.

The invention will be more clearly understood by reference to the following examples.

EXAMPLE 1

Aqueous resist films were prepared in the following manner.

The following ingredients were added to a container equipped with an air stirrer for mixing.

| | |
|---|---|
| (1) Methylene chloride | 810.00 g |
| (2) Methanol | 80.00 g |
| (3) Styrene butyl maleate Acid No. 185 Mol. Wt. 20,000 (Available from Monsanto as Scripset ® 640) | 157.50 g |
| (4) Styrene acrylic acid Acid No. 200 softening point 144° C. (Available from Johnson Wax as Joncryl ® 67) This was stirred for 30 minutes. | 114.80 g |
| (5) 2,2'-bis-(O—chlorophenyl)-4,4',5,5'-tetraphenylbiimidazole This was stirred for 5 minutes. | 7.60 g |
| (6) Benzophenone | 22.50 g |
| (7) Michler's ketone | 22.50 g |
| (8) Leuco crystal violet C.I. 42555 | 1.80 g |
| (9) Para toluene sulfonic acid This was stirred for 5 minutes. | 0.45 g |
| (10) Trimethylolpropanetriacrylate | 126.00 g |
| (11) Triethylene glycol dimethacrylate This was stirred for 5 minutes. | 13.50 g |
| (12) C.I. Basic Green 4 | 0.14 g |
| (13) 1,4,4-trimethyl-2,5-diazobicyclo [3.2.2]-non-2-ene-N,N—dioxide | 0.45 g |

This was stirred for 30 minutes.

Then 298 g of this final composition was added to each of three containers containing the following solid dissolved in 5 g methanol.

A. 0.4 g benzotriazole
B. 0.4 g 5-chlorobenzotriazole
C. 0.4 g anhydrous citric acid A and B served as controls containing adhesion promoters as taught in U.S. Pat. No. 3,622,334.

C which contained citric acid as a low molecular weight, water soluble acid represents the concept of the present invention.

These solutions were coated on a polyethylene terephthalate support using a 0.0152 cm doctor knife to give coatings of 0.0035 to 0.0038 cm thickness.

These resist films were then laminated to copper clad epoxy-fiber boards and held for various times to determine scum formation or surface stain on the copper. Lamination was carried out with the aid of rubber coated rollers operation at 100° to 115° C. with a pressure of 3 pounds per linear inch at the nip, at a rate of 2 feet per minute.

Exposure of the boards used, as a radiation source, a scanning mercury arc, DMVL, Colight Co., Minneapolis, Minn. After a 15-second exposure, the polyethylene terephthalate support film was peeled off and discarded leaving the exposed resist adherent to the copper surface. The board was then developed by placing it in a spray of 0.04N NaOH at 105° F., at 30 lbs/in$^2$ at a distance of six inches from the spray nozzles. This step left the green resist on the copper in the pattern of the clear areas of the exposing transparency. For the process to be most useful, there should be no resist left in the complementary opaque areas.

No stain or scum was observed when the resist was held on the copper for one day. A strong stain was observed with the B composition after being held for four days, while the A composition showed a weak stain, but the present invention C composition showed no stain. Controls of the A and B compositions held for the same three-week period had severe stain and scum formation on the copper surface.

The substitution of citric acid of the present invention for either benzotriazole or 5-chlorobenzotriazole gave an improved film which was far superior in ability to be held laminated to a copper surface without adverse staining or scumming. Relative to the controls, a decrease in the line holding of the experimental film was observed, i.e., 4 to 5 mil lines for C versus 2 to 3 mil lines for A and B. Other properties of etch rate, sensitivity, flexibility, and wetability were equal to or better than the controls.

A Rame-Hart contact angle goniometer (Model A100) was used to measure contact angles of 0.01 cm$^3$ drops of 2% ethyl cellosolve in water after the processed boards were etched for 10 seconds in ammonium persulfate. Lower contact angles indicate cleaner surfaces. Table 1 gives results of the contact angles obtained on different aged laminated films given equivalent processing.

TABLE 1

| Film | One Day | 4 Days | 7 Days |
|---|---|---|---|
| A | 17 | 20 | 57 |
| B | 11 | 12 | 24 |
| C | 8 | 8 | 8 |

As indicated in Table 1, even after being held for 1 to 7 days, the present invention shows no indication of a contaminated surface, while the controls show higher and increasing contact angles which correlate with stain formation. The contact angle test shows differentiation in the films after being held laminated to the copper surface for one day, whereas by visual observation, no stain was observed on any of these.

EXAMPLE 2

Example 1 was repeated except that malonic, malic and maleic acids were used instead of citric acid in the amount of 0.4%. An improved resistance to staining and scumming was obtained similar to that observed in Example 1 for citric acid.

EXAMPLE 3

When sebacic, benzoic, oxalic, chlorosuccinic, pimelic, azelaic, adipic, glutaric, phthalic, and succinic acids were incorporated in the resist formulation of Example 1, an improvement in resistance to scumming and staining was obtained. These were not effective in preventing stain for up to a period of one week, as was the case for the acids covered in Examples 1 and 2.

What is claimed is:

1. An element comprising a copper substrate contacting a film of an aqueous processable photopolymerizable resist composition comprising a photopolymerizable ethylenically unsaturated monomer, a photoinitiator or photoinitiator system, a binder with an acid number greater than 100, and an acid having a molecular weight not greater than 300 with a solubility of at least 0.01 grams acid in 100 grams of water at 20° C. and a disassociating constant in the range from $1 \times 10^{-5}$ to $5 \times 10^{-2}$, said acid present in an amount sufficient to inhibit stain or scum formation of said composition on a copper surface whereby the film has the property that after areawise exposure to a scanning mercury arc and development with 0.04N NaOH at 105° F., it is adherent in areas exposed to the mercury arc and nonadherent in areas not exposed to the mercury arc.

2. The element of claim 1 wherein the acid has a molecular weight not greater than 250.

3. The element of claim 1 wherein the acid is a carboxylic acid.

4. The element of claim 1 wherein the acid is present in an amount from 0.01 to 1.0% by weight of said monomer, photoinitiator or photoinitiator system and binder.

5. The element of claim 1 wherein the acid is present in an amount from 0.1% to 5% by weight of said monomer, photoinitiator or photoinitiator system and binder.

6. The element of claim 1 wherein the acid is selected from the group consisting of citric, malonic, malic, and maleic acid.

7. The element of claim 1 wherein the acid is selected from the group consisting of sebacic, benzoic, chlorosuccinic, pimelic, azelaic, adipic, glutaric, phthalic, and succinic acid.

8. The element of claim 7 wherein the acid is present in an amount from 0.01% to 1.0% by weight of said monomer, photoinitiator or photoinitiator system and binder.

9. The element of claim 1 with a cover sheet in contact with the film.

10. The element of claim 9 wherein the cover sheet comprises polyethylene or polyethylene terephthalate.

* * * * *